(12) United States Patent
Kim et al.

(10) Patent No.: US 9,135,996 B2
(45) Date of Patent: Sep. 15, 2015

(54) VARIABLE RESISTANCE MEMORY DEVICE AND RELATED METHOD OF OPERATION

(71) Applicant: SAMSUNG ELECTRONICS CO., LTD., Suwon-si, Gyeonggi-do (KR)

(72) Inventors: Deok-kee Kim, Seoul (KR); Ho Jung Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 58 days.

(21) Appl. No.: 14/047,626

(22) Filed: Oct. 7, 2013

(65) Prior Publication Data

US 2014/0036575 A1 Feb. 6, 2014

Related U.S. Application Data

(62) Division of application No. 13/009,077, filed on Jan. 19, 2011, now Pat. No. 8,559,207.

(30) Foreign Application Priority Data

Feb. 10, 2010 (KR) .................. 10-2010-0012486

(51) Int. Cl.
*G11C 13/00* (2006.01)
(52) U.S. Cl.
CPC ........ *G11C 13/0069* (2013.01); *G11C 13/0064* (2013.01); *G11C 2013/0066* (2013.01); *G11C 2213/72* (2013.01)

(58) Field of Classification Search
CPC ................... G11C 2013/0066; G11C 2213/15; G11C 13/0064; G11C 13/0069; G11C 2213/0072
See application file for complete search history.

(56) References Cited

U.S. PATENT DOCUMENTS

| 7,082,051 | B2 | 7/2006 | Ha et al. |
| 7,085,154 | B2 | 8/2006 | Cho et al. |
| 7,224,598 | B2 | 5/2007 | Perner |
| 7,974,122 | B2 | 7/2011 | Lin et al. |
| 8,223,529 | B2 * | 7/2012 | Kim et al. ...................... 365/148 |
| 2014/0233331 | A1 * | 8/2014 | Foong et al. ............. 365/189.16 |

FOREIGN PATENT DOCUMENTS

| JP | 2004234707 A | 8/2004 |
| KR | 1020080022184 A | 3/2008 |
| WO | 2008012871 A1 | 1/2008 |

* cited by examiner

*Primary Examiner* — Harry W Byrne
*Assistant Examiner* — Lance Reidlinger
(74) *Attorney, Agent, or Firm* — Volentine & Whitt, PLLC

(57) ABSTRACT

A variable resistance memory device includes a variable resistance memory cell, a switch that selectively passes a write voltage to an input terminal of the variable resistance memory cell, and a trigger circuit that controls the switch to cut off the write voltage from the input terminal upon determining that the variable resistance memory cell is programmed to a target state by detecting voltage fluctuation of the one side of variable resistance memory cell.

14 Claims, 20 Drawing Sheets

VARIABLE RESISTANCE MEMORY DEVICE AND RELATED METHOD OF OPERATION

CROSS-REFERENCE TO RELATED APPLICATIONS

This is a Divisional application of U.S. application Ser. No. 13/009,077, filed Jan. 19, 2011, now U.S. Pat. No. 8,559,207, which claims priority under 35 U.S.C. §119 to Korean Patent Application No. 10-2010-0012486 filed on Feb. 10, 2010, the disclosure of which is hereby incorporated by reference in its entirety.

BACKGROUND

Embodiments of the inventive concept relate generally to electronic memory technologies. More particularly, embodiments of the inventive concept relate to nonvolatile memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM), and examples of nonvolatile memory devices include ferroelectric random access memory (FRAM), magnetoresistive random access memory (MRAM), phase-change random access memory (PRAM), and resistive random access memory (RRAM).

Resistive random access memory (RRAM) has the potential for high storage capacity, high performance, and low power consumption. Accordingly, extensive research is being conducted in the field of RRAM technology to improve the characteristics of RRAM devices. An RRAM device stores data using a variable resistance material layer that changes resistance according to the polarity and size of an applied electrical pulse. One type of variable resistance material layer is a colossal magnetoresistive (CMR) material layer having a perovskite structure.

RRAM and other memories using a variable resistance material layer are referred to as variable resistance memories. Variable resistance memory devices can be classified as unipolar devices and bipolar devices according to polarity of a writing pulse. In a unipolar variable resistance device, a set pulse and a reset pulse have the same polarity. As a result, unipolar variable resistance memory devices may exhibit unstable performance in the presence of a unipolar pulse.

SUMMARY

According to one embodiment of the inventive concept, a variable resistance memory device comprises a variable resistance memory cell, a switch that selectively passes a write voltage to an input terminal of the variable resistance memory cell, and a trigger circuit that controls the switch to cut off the write voltage from the input terminal of the variable resistance memory cell upon determining that the variable resistance memory cell is programmed to a target state by detecting a voltage fluctuation at the input terminal.

In certain embodiments, the variable resistance memory cell comprises a variable resistance device comprising a unipolar resistance memory material.

In certain embodiments, the switch comprises a transistor controlled by the trigger circuit.

In certain embodiments, the trigger circuit comprises a comparator that compares a voltage level of the input terminal with a reference voltage to generate a comparison result and generates a switch control signal for controlling the switch according to the comparison result.

In certain embodiments, the comparator generates the switch control signal with a logic level that causes the switch to cut off the write voltage from the input terminal upon determining that the voltage level of the input terminal is higher than the reference voltage.

In certain embodiments, the trigger circuit further comprises a first multiplexer that selects and outputs the comparison result or an inverted comparison result according to the target state, and a second multiplexer that selects and outputs an output of the first multiplexer or a row select signal to generate the switch control signal.

In certain embodiments, the first multiplexer selects the inverted comparison result where the target state is a reset state and selects the comparison result where the target state is a set state.

In certain embodiments, the comparator generates the comparison result with a high logic level where the voltage level of the input terminal is lower than the reference voltage.

In certain embodiments, the reference voltage is controlled according to a magnitude of a signal delay between the switch and the variable resistance memory cell.

In certain embodiments, the reference voltage is lowered as the magnitude of the signal delay increases.

In certain embodiments, the variable resistance memory device further comprises a bypass circuit that selectively connects the input terminal of the variable resistance memory cell to an output terminal of the variable resistance memory cell under the control of the trigger circuit.

According to another embodiment of the inventive concept, a variable resistance memory device comprises a cell array comprising a plurality of variable resistance memory cells, a read/write circuit that provides a write voltage to a selected memory cell among the plurality of variable resistance memory cells through a bit line, determines whether the selected memory cell is programmed by comparing a reference voltage to a voltage level of the bit line, and cuts off the write voltage from the bit line according to the comparison, and a reference voltage generator that generates the reference voltage with a magnitude that varies according to an address of the selected memory cell.

In certain embodiments, the reference voltage generator classifies the plurality of memory cells into a plurality of groups according to corresponding addresses and generates the reference voltage with a different magnitude for each of the plurality of groups.

In certain embodiments, the reference voltage generator generates the reference voltage with a lower magnitude for groups located farther from the read/write circuit.

In certain embodiments, the variable resistance memory device further comprises control logic that controls the reference voltage generator according to a row address of the selected memory cell to vary the magnitude of the reference voltage.

In certain embodiments, the read/write circuit comprises a transistor that selectively passes the write voltage to the bit line, and a trigger circuit that prevents the transistor from passing the write voltage to the transistor upon determining that the selected memory cell is programmed to a target state by comparing the reference voltage and the voltage level of the bit line.

According to another embodiment of the inventive concept, a method of programming a variable resistance memory device comprises applying a write voltage to an input terminal of a variable resistance memory cell, determining whether the variable resistance memory cell is programmed to a target state by detecting a voltage fluctuation at the input terminal, and cutting off the write voltage from the input terminal upon determining that the variable resistance memory cell is programmed to a target state.

In certain embodiments, determining whether the variable resistance memory cell is programmed to the target state comprises comparing a voltage level of the input terminal with a reference voltage.

In certain embodiments, the reference voltage is adjusted according to a delay required for the write voltage to reach the variable resistance memory cell.

In certain embodiments, the variable resistance memory cell comprises a unipolar variable resistance device.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

Figure 1A:
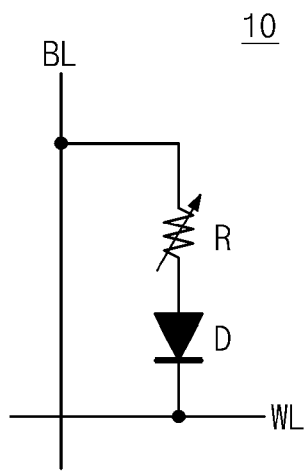
FIGS. 1A and 1B are circuit diagrams illustrating a memory cell of a variable resistance memory device.
Figure 1B:
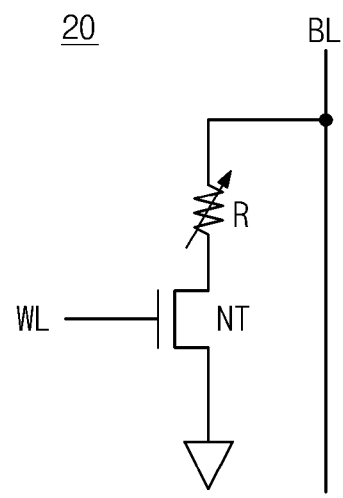

FIGS. 1A and 1B are circuit diagrams illustrating a memory cell of a variable resistance memory device.

Referring to FIG. 1A, a memory cell 10 comprises a variable resistance device R and a diode D. Variable resistance device R comprises a variable resistance material for storing data. Diode D is a select device (or a switching device) that supplies or cuts off a current to variable resistance device R according to bias voltages of a wordline WL and a bitline BL. Diode D is connected between variable resistance device R and wordline WL, and variable resistance device R is connected between bitline BL and diode D. However, the relative locations of variable resistance device R and diode D can be exchanged.

Although not illustrated in the drawings, variable resistance device R typically comprises a pair of electrodes and a data storage layer formed between the electrodes. The data storage layer can be formed from a bipolar resistance memory material or a unipolar resistance memory material. The bipolar resistance memory material is programmed to a set state or a reset state according to a polarity of an applied electrical pulse. The unipolar resistance memory material is programmed to a set state or a reset state by an electrical pulse having the same polarity. The unipolar resistance memory material typically comprises a unitary transition metal oxide such as $NiO_x$ or $TiO_x$.

Diode D of memory cell 10 is turned on or turned off depending on a bias of wordline WL or bitline BL. Where a forward voltage of diode D is higher than a threshold voltage of diode D, diode D is turned on. Where diode D is turned on, a program current is provided to variable resistance device R.

Referring to FIG. 1B, a memory cell 20 comprises a variable resistance device R and a transistor NT. Variable resistance device R can be formed in the substantially same manner as variable resistance device R of FIG. 1A. Transistor NT is turned on or off according to a bias of a wordline WL. Accordingly, transistor NT is a select device (or a switching device) that supplies or cuts off a current to variable resistance device R.

Figure 2A:
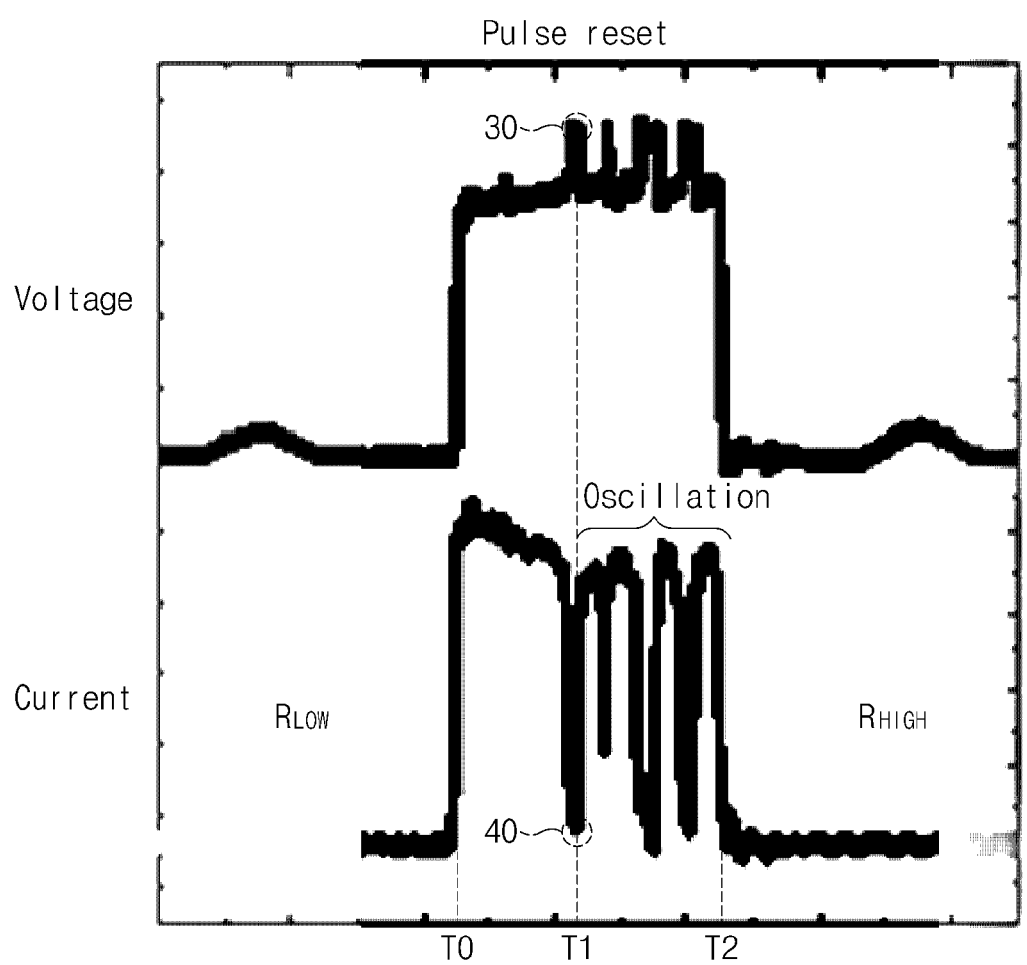
FIGS. 2A and 2B are waveforms illustrating program characteristics of a variable resistance device.
Figure 2B:
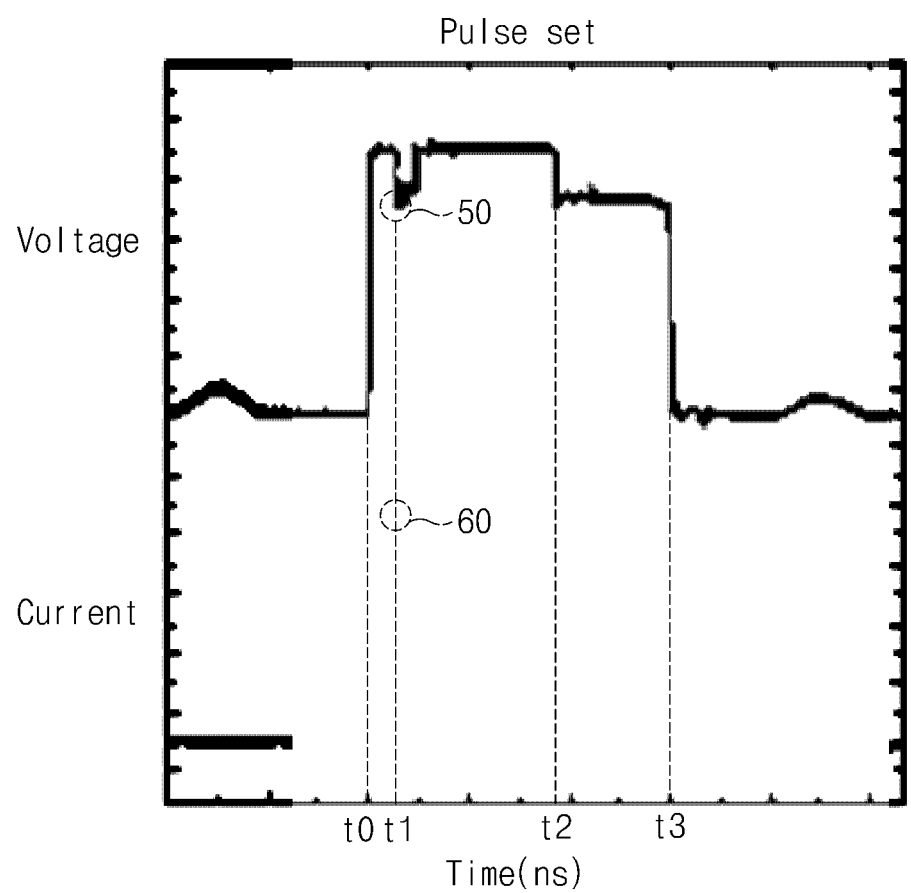

FIGS. 2A and 2B are waveforms showing a program characteristic of a variable resistance device. In particular, FIG. 2A is a waveform view showing a fluctuation of a voltage and a current of a variable resistance device programmed to a reset state. FIG. 2B is a waveform view showing a fluctuation of a voltage and a current of a variable resistance device programmed to a set state.

Referring to FIG. 2A, a reset voltage is applied to a variable resistance device to program the variable resistance device to a reset state. In response to the reset voltage, the variable resistance device changes from a set state, which is a low resistance state, to the reset state, which is a high resistance state. Where the reset voltage is applied to the variable resistance device at a time of T0, a current having a waveform illustrated in FIG. 2A flows through the variable resistance device.

The variable resistance device changes from the set state to the reset state if the reset voltage is maintained higher than a specific level for a sufficient time. For example, the variable resistance device changes to the reset state at a time of T1, and consequently, current is rapidly reduced. At time T1, the variable resistance device may be programmed to the reset state. In the drawings, a voltage peak 30 and a current trough 40 indicate a point of time where the variable resistance device is first programmed to the reset state. However, the reset voltage continues to be applied to the variable resistance device beyond that point of time.

The resistance of the variable resistance device tends to remain stable in the presence of relatively lower voltages, such as 1.0V or less. However, in the presence of the reset pulse, the resistance of the variable resistance device can fluctuate irregularly between a high resistance state and a low resistance state. This fluctuation can produce a current vibration such as that shown in a time interval T1-T2 of FIG. 2A. The instability of the variable resistance device lasts until time T2 at which the reset voltage is no longer applied to the variable resistance device. Accordingly, a final resistance state of the variable resistance device can vary at time T2.

In certain embodiments of the inventive concept, during an operation for programming the variable resistance device to the reset state, the reset voltage is cut off upon reaching a point of time where voltage peak 30 or current peak 40 occurs. By cutting off the reset voltage at a point of time where voltage peak 30 or current peak 40 occurs, the variable resistance device can be stabilized to a high resistance state.

Referring to FIG. 2B, a set voltage is applied to the variable resistance device to program the variable resistance device to a set state. In response to the set voltage, the variable resistance device changes from the reset state to the set state. Where the set voltage is applied to the variable resistance device at a time of t0, current flows through the variable resistance device as illustrated in FIG. 2B.

The variable resistance device changes from the reset state to the set state if the set voltage is maintained higher than a specific level for a sufficient time. However, where the set pulse is maintained for too long, the resistance of the variable resistance device can fluctuate irregularly between a high resistance state and a low resistance state. Accordingly, a final resistance state of the variable resistance device can vary at a time t3 at which the set voltage is cut off.

In certain embodiments of the inventive concept, in an operation for programming the variable resistance device to the set state, the set voltage is cut off upon reaching a point of time where a voltage peak 50 or a current peak 60 occurs. By cutting off the set voltage in this manner, the variable resistance device can be stabilized at the low resistance state.

Figure 3:
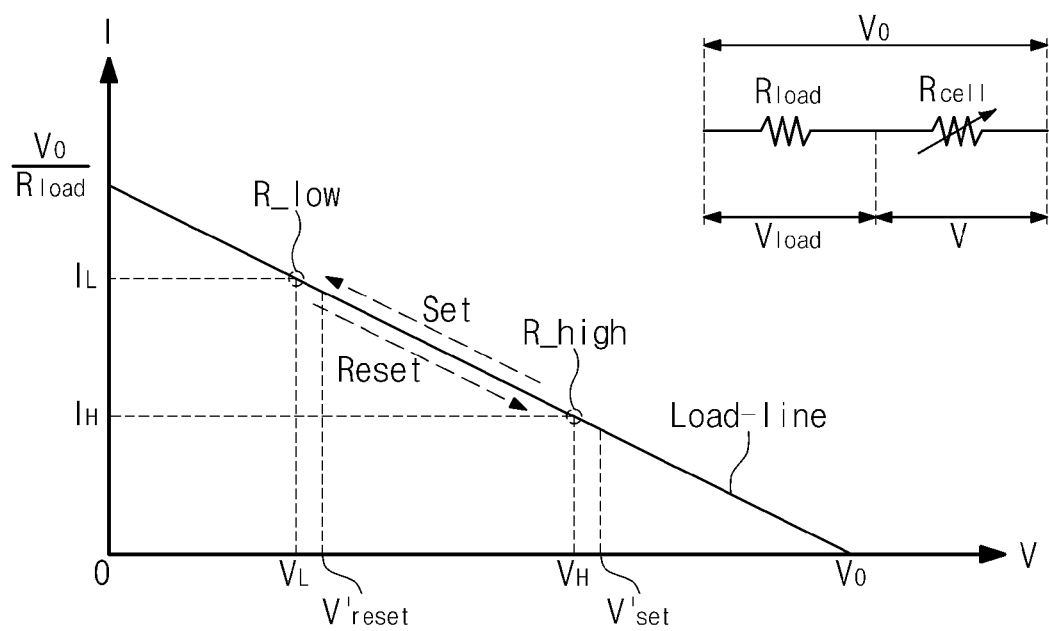
FIG. 3 is a graph illustrating a load characteristic of a variable resistance device during a program operation.

FIG. 3 is a graph illustrating a load characteristic of a variable resistance device during a program operation. More particularly, FIG. 3 shows a load-line of a memory cell comprising a variable resistance device modeled as a load resistance $R_{load}$ and a cell resistance $R_{cell}$.

The load-line represents a memory cell current I as a function of a $V_0$–V, where $V_0$ is a fixed value. Specifically, the load-line is defined by the following Equation (1).

$$I = \frac{V_0 - V}{R_{load}} \qquad (1)$$

In an operation where a memory cell having a cell resistance $R_{cell}$ is programmed from a high resistance state R_high to a low resistance state R_low, cell resistance $R_{cell}$ is unstable until a voltage V falls below a certain level. For example, under certain conditions, where voltage V is higher than a specific voltage $V'_{reset}$, cell resistance $R_{cell}$ may return to high resistance state R_high, which can invalidate a set program operation. On the other hand, where cell resistance $R_{cell}$ is programmed to high resistance state R_high and voltage V is higher than a specific voltage $V'_{set}$, cell resistance $R_{cell}$ can return to low resistance state R_low. Accordingly, cell resistance $R_{cell}$ can fluctuate between the set state and the reset state until the reset voltage or the set voltage is removed. This can affect both the reliability of stored data and the life the memory cell.

Figure 4:
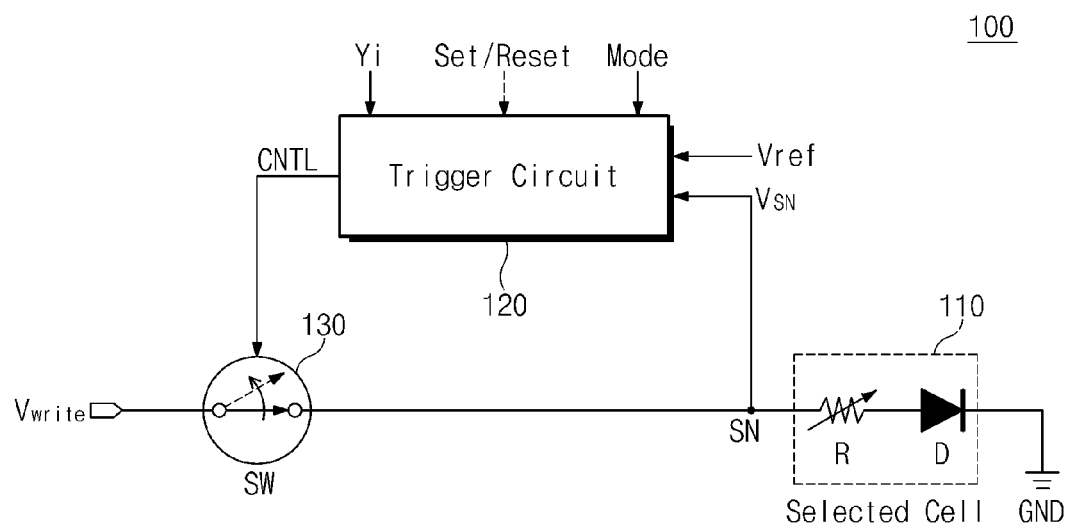
FIG. 4 is a block diagram illustrating a variable resistance memory device in accordance with an embodiment of the inventive concept.

FIG. 4 is a block diagram illustrating a variable resistance memory device 100 according to an embodiment of the inventive concept.

Referring to FIG. 4, variable resistance memory device 100 comprises a memory cell 110, a trigger circuit 120, and a switch 130.

In a program operation, a write voltage $V_{write}$ is applied to a terminal SN of memory cell 110 and another terminal of memory cell 110 is connected to ground. In this example, memory cell 110 comprises a variable resistance device R and a diode D. However, in alternative embodiments, memory cell 110 can be formed by other features, such as a transistor NT and a variable resistance device R.

In response to the application of write voltage $V_{write}$, trigger circuit 120 detects a node voltage $V_{SN}$ formed on terminal SN of memory cell 110. Trigger circuit 120 compares the detected node voltage $V_{SN}$ with a reference voltage Vref and turns switch 130 on or off according to the comparison. Switch 130 is controlled by a switch control signal CNTL output from trigger circuit 120. Write voltage $V_{write}$ is provided to memory cell 110 according to whether switch 130 is turned on or turned off.

Trigger circuit 120 monitors node voltage $V_{SN}$ to detect a point of time at which memory cell 110 is first programmed and cuts off write voltage $V_{write}$ after the detected point of time. By cutting off write voltage $V_{write}$ in this manner, trigger circuit 120 prevents memory cell 110 from fluctuating between the set state and the reset state.

Trigger circuit 120 receives reference voltage Vref and control signals Mode, Set/Reset, and Yi. The control signal Mode indicates a program mode or a read mode of variable resistance memory device 100. Trigger circuit 120 activates switch control signal CNTL in the program mode. State signal Set/Reset indicates a state to which memory cell 110 is to be programmed. Row select signal Yi is a signal for activating switch 130 in the read mode. For example, where memory cell 110 is to be programmed to the set state, state signal Set/Reset indicates the set state, and the mode signal indicates the program mode.

Figure 5:
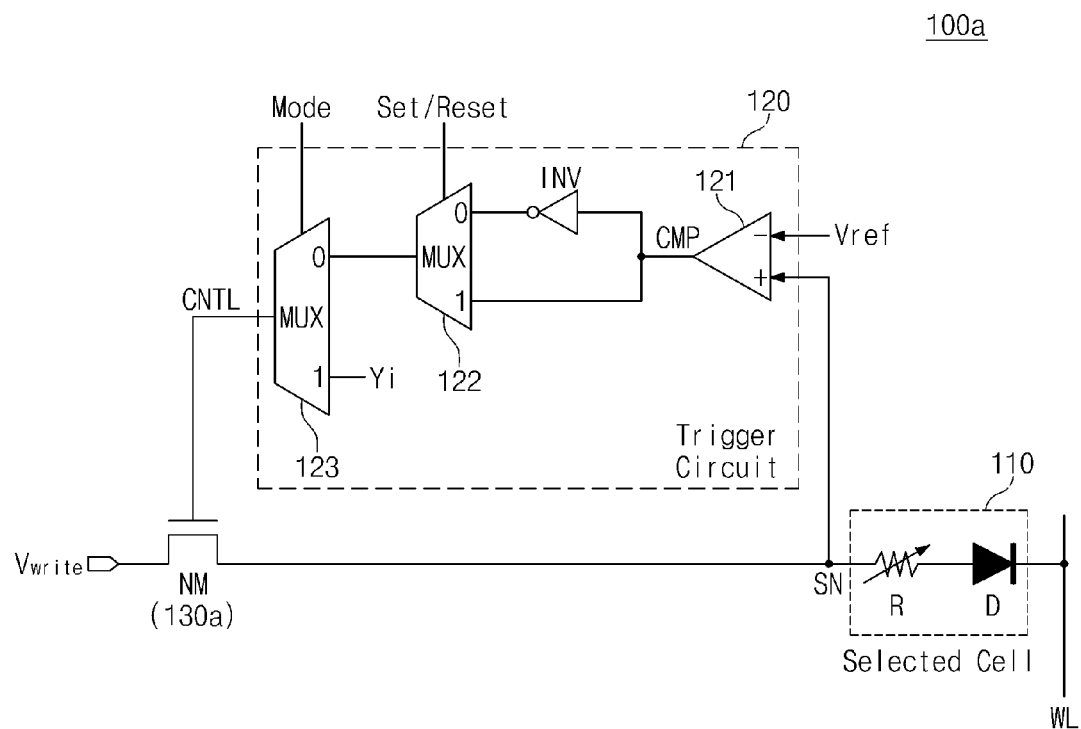
FIG. 5 is a circuit diagram illustrating a variable resistance memory device in accordance with an embodiment of the inventive concept.

FIG. 5 is a circuit diagram illustrating a variable resistance memory device 100a in accordance with an embodiment of the inventive concept.

Referring to FIG. 5, variable resistance memory device 100a comprises memory cell 110, trigger circuit 120, and a switch 130a.

Memory cell 110 is substantially the same as memory cell 110 illustrated in FIG. 4. Switch 130a comprises an NMOS transistor NM that is turned on or turned off by switch control signal CNTL.

Trigger circuit 120 comprises a differential amplifier 121, an inverter INV, and multiplexers 122 and 123. Differential amplifier 121 compares node voltage $V_{SN}$ and reference voltage Vref. Where node voltage $V_{SN}$ is higher than reference voltage Vref, differential amplifier 121 outputs a comparison signal CMP with a logic state "high" (or logic '1'). Where node voltage $V_{SN}$ is lower than reference voltage Vref, differential amplifier 121 outputs comparison signal CMP with a logic state "low" (or logic '0').

Comparison signal CMP is transmitted to a first input of multiplexer 122. Comparison signal CMP is inverted by inverter INV to be transmitted to a second input of multiplexer 122. Where memory cell 110 is to be programmed to the set state, multiplexer 122 selects the first input, and where memory cell 110 is to be programmed to the reset state, multiplexer 122 selects the second input.

Multiplexer 123 selects an output of multiplexer 122 in the program mode and selects row select signal Yi in other modes, such as the read mode. The signal selected by multiplexer 123 is output as switch control signal CNTL. Switch control signal CNTL is provided as a gate voltage for NMOS transistor NM.

Figure 6A:
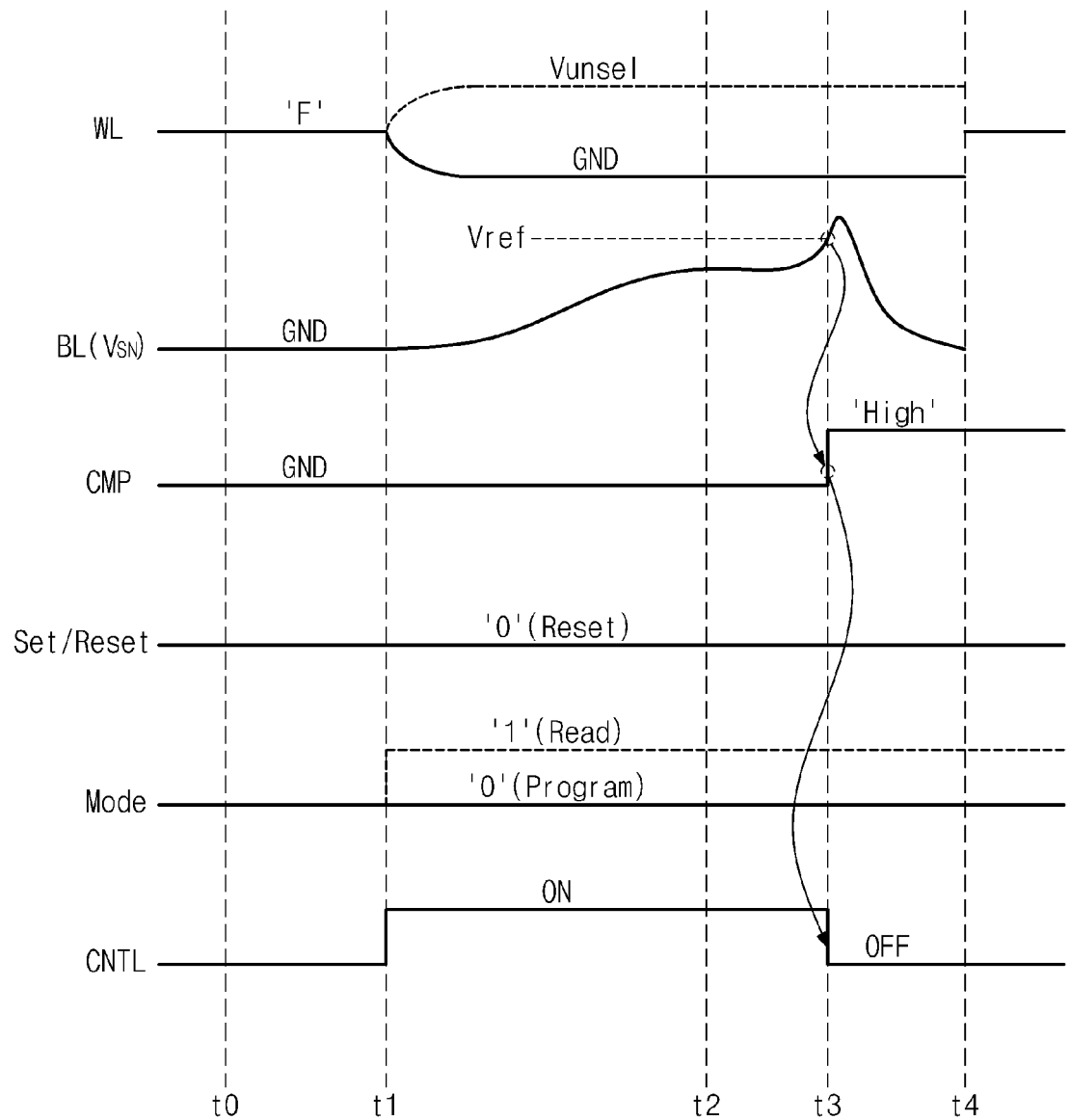
FIGS. 6A and 6B are timing diagrams illustrating an operation of a trigger circuit illustrated in FIG. 5.
Figure 6B:
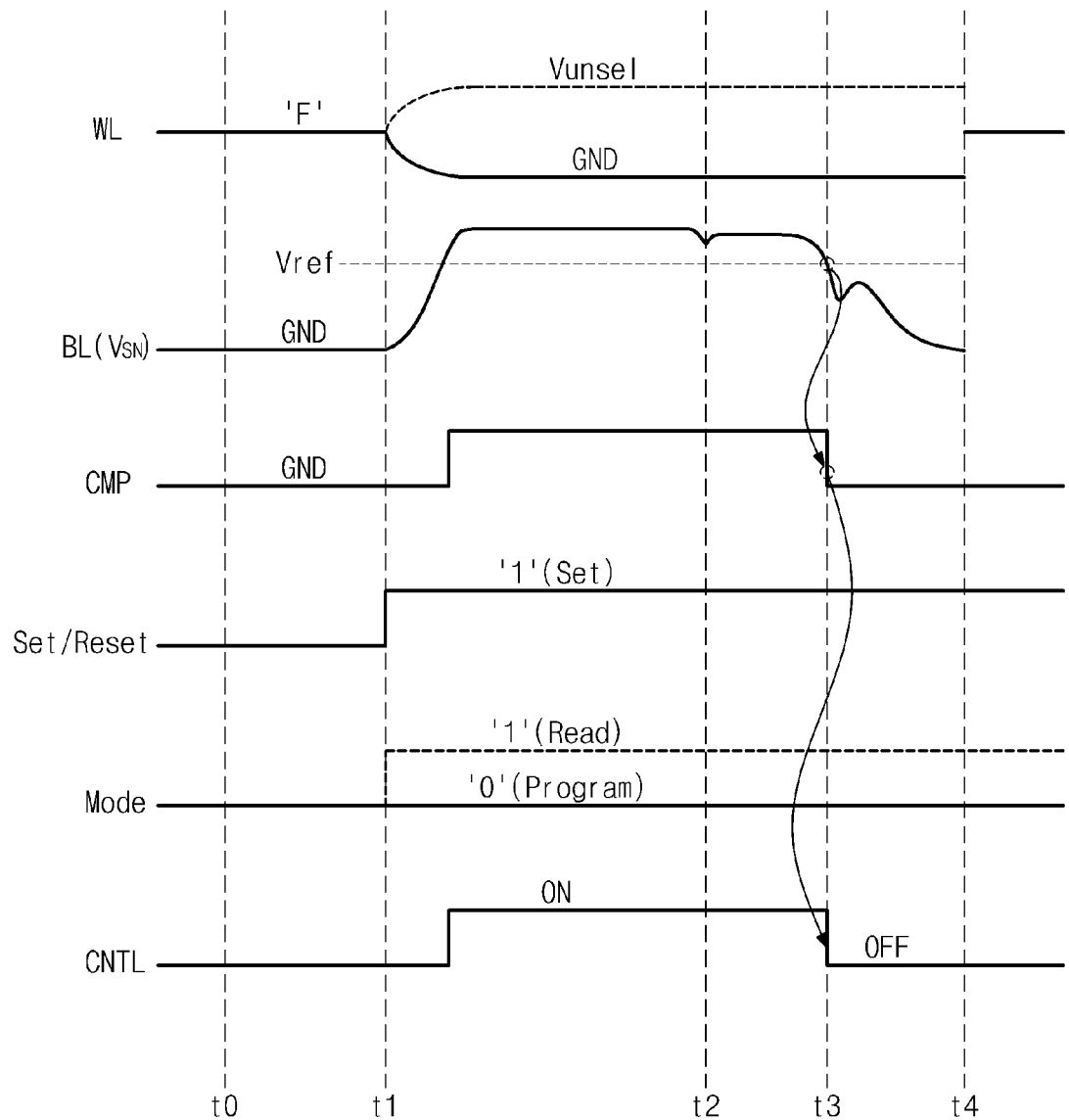

FIGS. 6A and 6B are timing diagrams illustrating a reset program operation and a set program operation of variable resistance memory device 100a. In particular, FIG. 6A illustrates the reset program operation, and FIG. 6B illustrates the set program operation.

Referring to FIG. 6A, in an interval t0-t1, a memory cell to be programmed to the reset state is selected according to a command and an address. Then, at time t1, a selected wordline WL is biased from a floating state F to ground GND, and unselected wordlines are biased to an unselect voltage Vunsel. State signal Set/Reset is set to logic '0' to select the second input of multiplexer 122, and mode signal Mode is set to logic '0' to indicate a program operation.

Switch control signal CNTL is output as logic '1' until node voltage $V_{SN}$ reaches reference voltage Vref. Then, comparison signal CMP is inverted at time t3 where node voltage $V_{SN}$ reaches reference voltage Vref. In response to the inversion of comparison signal CMP, switch control signal CNTL is inverted. Where switch control signal CNTL is inverted, NMOS transistor NM is turned off. Then, write voltage $V_{write}$ is no longer provided to memory cell 110, and node voltage $V_{SN}$ is lowered. Because the level of node voltage $V_{SN}$ is lowered, memory cell 110 is prevented from exhibiting unstable states.

Referring to FIG. 6B, in a first interval t0-t1, a memory cell to be programmed to the set state is selected according to a command and an address. Then, at a time t1, a selected wordline WL is biased from floating state F to ground GND, and unselected wordlines are biased to an unselect voltage Vunsel. State signal Set/Reset is set to logic '1' to select the first input of multiplexer 122, and mode signal Mode is set to logic '0' to indicate a program operation.

Switch control signal CNTL is output as logic '0' until node voltage $V_{SN}$ reaches reference voltage Vref. Then, switch control signal CNTL is switched to logic '1' to turn on NMOS transistor NM until node voltage $V_{SN}$ falls below reference voltage Vref at a time t3. At time t3, comparison signal CMP is inverted, which causes switch control signal CNTL to become inverted, turning off NMOS transistor NM. Then, write voltage $V_{write}$ is cut off from memory cell 110, and a level of node voltage $V_{SN}$ is lowered. Because the level of node voltage $V_{SN}$ is lowered, memory cell 110 is prevented from exhibiting unstable states.

Figure 7:
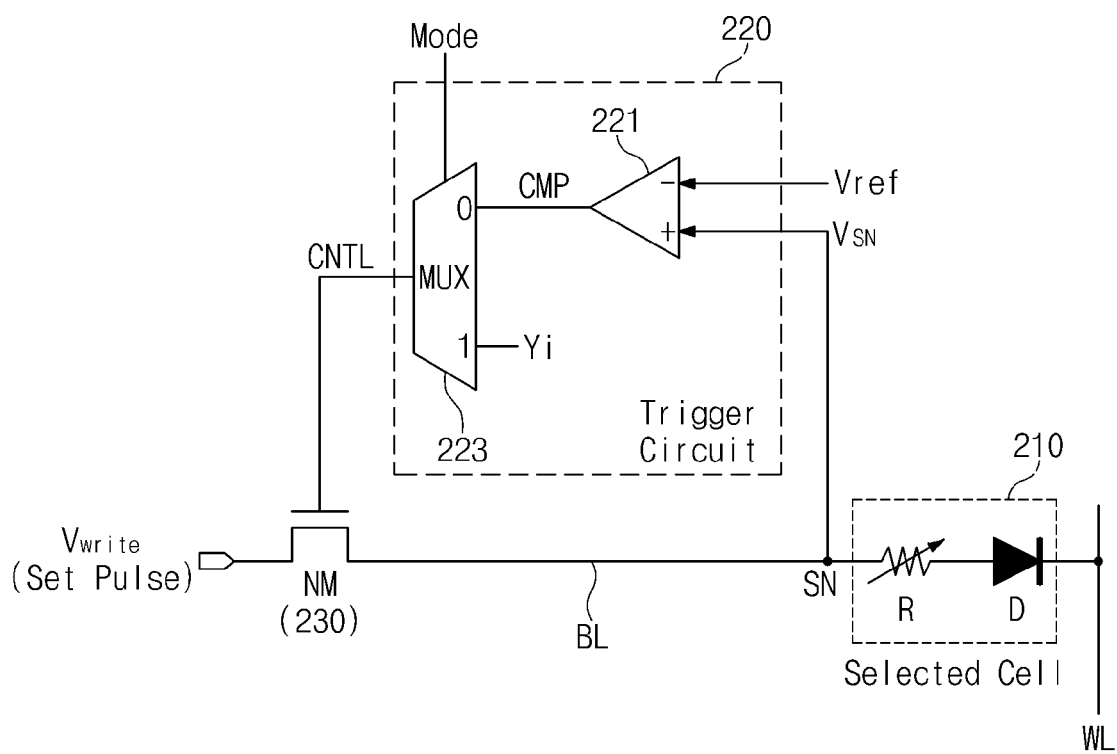
FIG. 7 is a circuit diagram illustrating a variable resistance memory device in accordance with an embodiment of the inventive concept.

FIG. 7 is a circuit diagram illustrating a variable resistance memory device 200 according to an embodiment of the inventive concept.

Referring to FIG. 7, variable resistance memory device 200 comprises a memory cell 210, a trigger circuit 220, and a transistor 230. In contrast to the trigger circuits of FIGS. 6A and 6B, trigger circuit 220 cuts off write voltage $V_{write}$ only where memory cell 210 is programmed to the set state.

Memory cell 210 and transistor 230 are substantially the same as memory cell 110 and transistor 130a illustrated in FIG. 5.

Trigger circuit 220 comprises a differential amplifier 221 and a multiplexer 223. Differential amplifier 221 compares a node voltage $V_{SN}$ with a reference voltage Vref and outputs a comparison signal CMP as logic '0' where node voltage $V_{SN}$ is lower than reference voltage Vref. Differential amplifier 221 outputs comparison signal CMP as logic '1' where node voltage $V_{SN}$ is higher than reference voltage Vref.

Comparison signal CMP is transmitted to a first input of multiplexer 223. Multiplexer 223 selects the first input during a program operation mode for writing data in memory cell 210. Multiplexer 223 selects row select signal Yi during a read operation mode for reading data from memory cell 210. Consequently, during the program operation mode, comparison signal CMP is provided as a switch control signal CNTL for controlling transistor 230.

Figure 8:
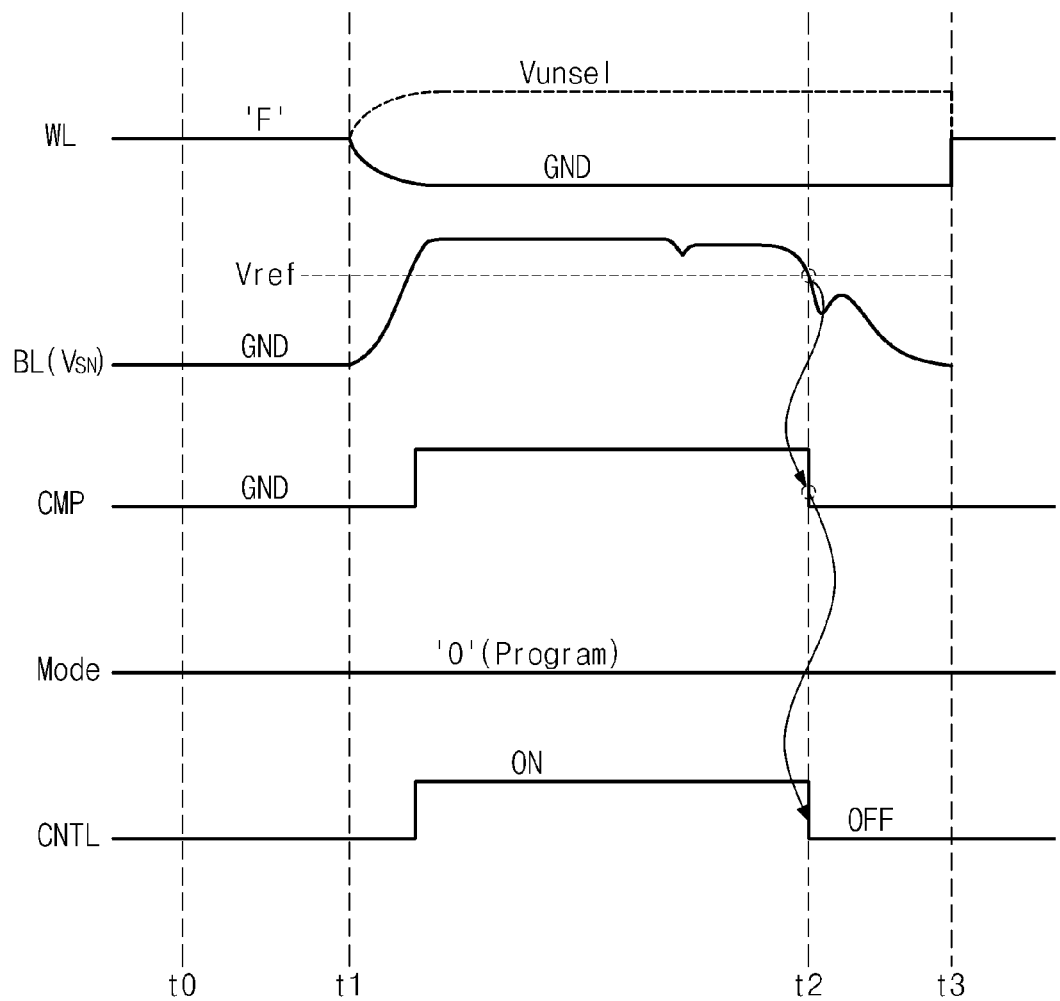
FIG. 8 is a timing diagram illustrating an operation of a trigger circuit illustrated in FIG. 7.

FIG. 8 is a timing diagram illustrating a set program operation of the variable resistance memory device of FIG. 7.

Referring to FIG. 8, in an interval t0-t1, a memory cell to be programmed to the reset state is selected according to a command and an address. Then, at a time t1, a selected wordline WL is biased to ground GND and unselected wordlines are biased to an unselect voltage Vunsel. Mode signal Mode is set to logic '0' to indicate a program operation. Consequently, comparison signal CMP is generated as switch control signal CNTL.

Switch control signal CNTL is output as logic '1' during an interval ending at a time t2 in which node voltage $V_{SN}$ is greater than reference voltage Vref. Then, at a time t2, node voltage $V_{SN}$ falls below reference voltage Vref, which causes comparison signal CMP to switch from logic '1' to logic '0'. Accordingly, switch control signal CNTL changes to logic '0' at time t2. Where switch control signal CNTL changes to logic '0', transistor 230 is turned off, which cuts off write voltage $V_{write}$ from node voltage $V_{SN}$. As a result, node voltage $V_{SN}$ is lowered to a level at which the resistance of memory cell 210 is stable.

Figure 9:
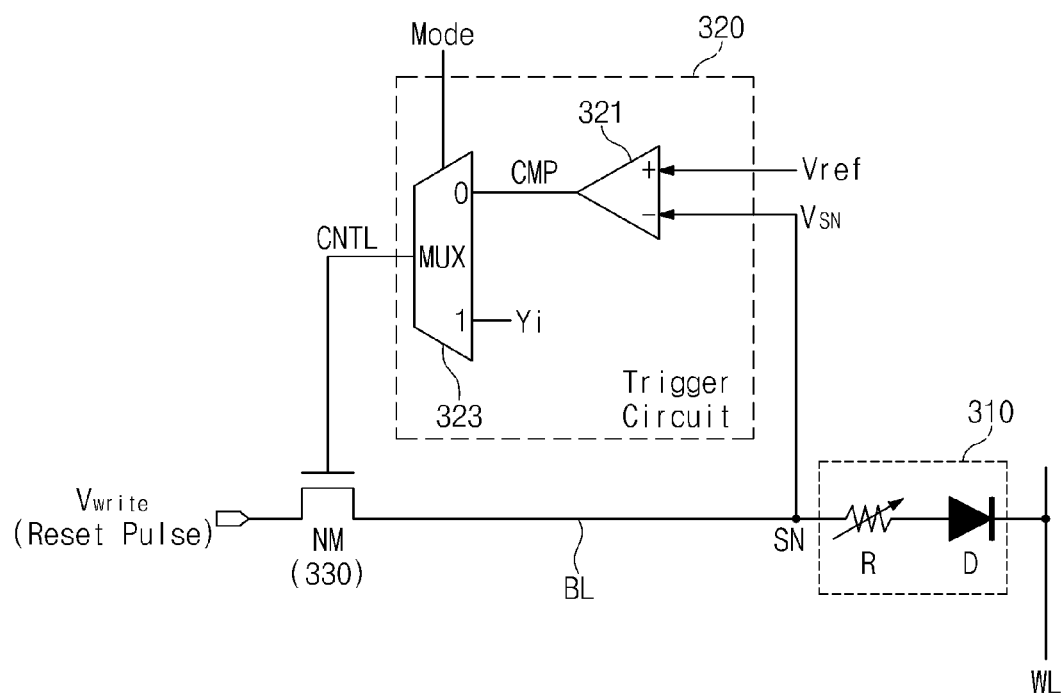
FIG. 9 is a circuit diagram illustrating a variable resistance memory device in accordance with an embodiment of the inventive concept.

FIG. 9 is a circuit diagram illustrating a variable resistance memory device 300 according to an embodiment of the inventive concept.

Referring to FIG. 9, variable resistance memory device 300 comprises a memory cell 310, a trigger circuit 320, and a transistor 330. Trigger circuit 320 cuts off write voltage $V_{write}$ from memory cell 310 where memory cell 310 is programmed to the reset state.

Trigger circuit 320 comprises a differential amplifier 321 and a multiplexer 323. Differential amplifier 321 compares a node voltage $V_{SN}$ to a reference voltage Vref. Differential amplifier 321 outputs a comparison signal CMP as logic '1' where node voltage $V_{SN}$ is lower than reference voltage Vref and outputs comparison signal CMP as logic '0' where node voltage $V_{SN}$ is higher than reference voltage Vref.

Comparison signal CMP is transmitted to an input of multiplexer 323. Multiplexer 323 selects comparison signal CMP in a program operation mode for writing data in memory cell 310. Multiplexer 323 selects row select signal Yi in a read operation mode for reading data from memory cell 310. Consequently, in the program operation mode, comparison signal CMP is provided as a switch control signal CNTL for controlling transistor 330.

Switch control signal CNTL transitions to logic '0' where node voltage $V_{SN}$ rises above reference voltage Vref. Consequently, switch control signal CNTL prevents write voltage $V_{write}$ from being provided to memory cell 310 after memory cell 310 is programmed to the reset state.

Figure 10:
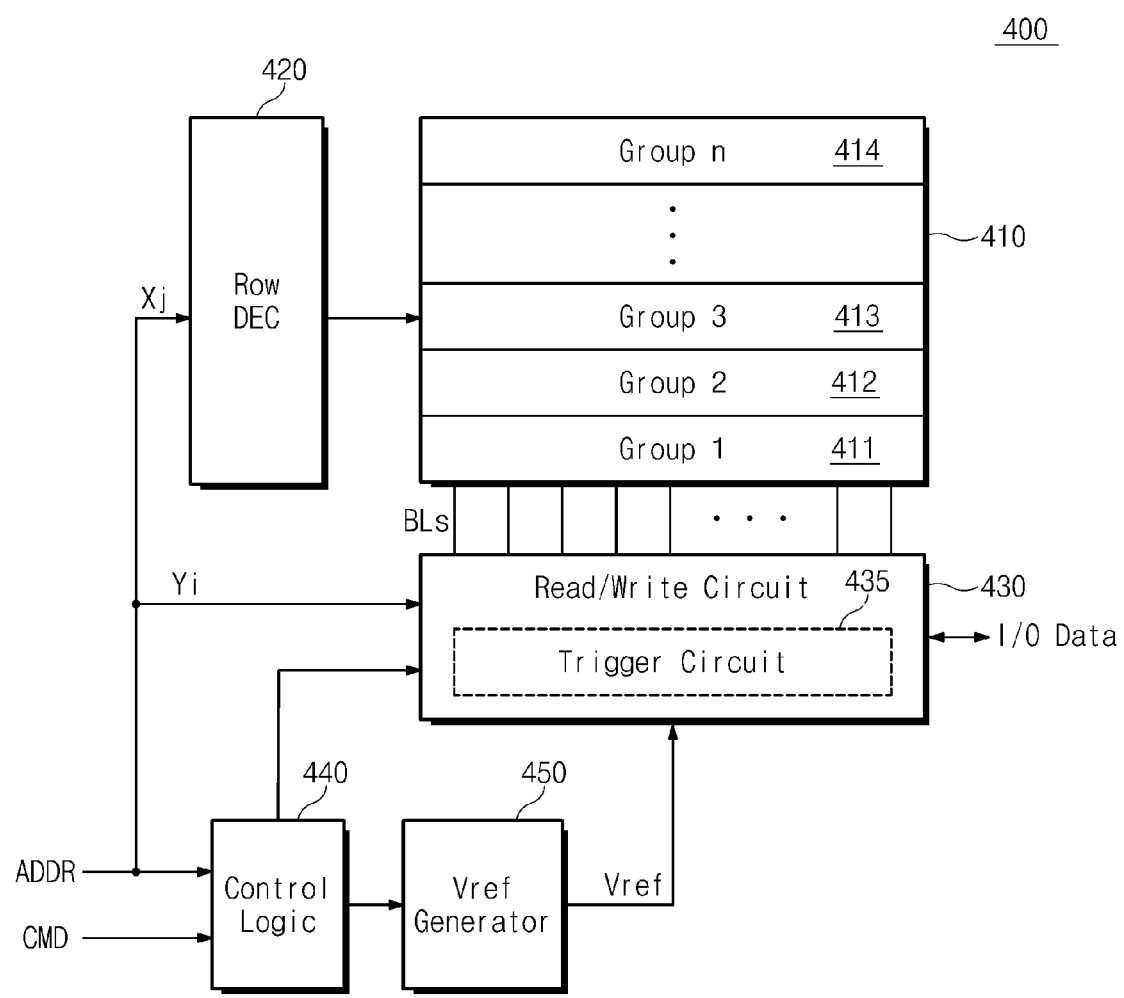
FIG. 10 is a block diagram illustrating a variable resistance memory device in accordance with an embodiment of the inventive concept.

FIG. 10 is a block diagram illustrating a variable resistance memory device 400 according to an embodiment of the inventive concept.

Referring to FIG. 10, variable resistance memory device 400 comprises a cell array 410, a row decoder 420, a read/write circuit 430, control logic 440, and a reference voltage generator 450.

Cell array 410 comprises a plurality of memory cells arranged in rows and columns. Each of the memory cells comprises a variable resistance device and a select device. Cell array 410 is divided into a plurality of groups according to row addresses. Each of the plurality of groups can be constituted by memory cells connected to the same wordline or memory cells connected to a set of adjacent wordlines.

The grouping of memory cells in cell array 410 typically depends on a spatial distance of the memory cells from a trigger circuit 435, as will be described below. As examples, memory cells in a first group 411 are farther from trigger circuit 435 than memory cells in a second group 412.

Memory cells in different groups have different timing delays with respect to trigger circuit 435, and node voltage $V_{SN}$ is applied to each selected memory cell after a delay corresponding to the group to which it belongs. Consequently, the reliability of program operations can be improved by adaptively controlling the timing of trigger circuit 435 according to the delay of each group unit.

Row decoder 420 decodes a row address Xj being input to select a row. Row decoder 420 selects a wordline corresponding to row address Xj to perform a program operation or a read operation.

Read/write circuit 430 selects a bitline corresponding to a column address Yi. In a read mode, read/write circuit 430 reads data of a selected memory cell connected to a selected bitline under the control of control logic 440. In a program mode, read/write circuit 430 writes data in a selected memory cell connected to a selected bitline under the control of control logic 440.

In a program mode, read/write circuit 430 controls a write voltage $V_{write}$ according to a reference voltage Vref provided by reference voltage generator 450. Read/write circuit 430 controls the supply of write voltage $V_{write}$ to selected bitlines using trigger circuit 435. In FIG. 10, trigger circuit 435 is located in read/write circuit 430, but it can be arranged in other locations in alternative embodiments.

Control logic 440 controls read/write circuit 430 and reference voltage generator 450 according to a command CMD and an address ADDR. For example, where command CMD is a read command, control logic 440 controls read/write circuit 430 so that read/write circuit 430 senses data from selected memory cells and outputs the sensed data. Where command CMD is a write command, control logic 440 controls read/write circuit 430 to program selected memory cells to a set state or a reset state.

In the program mode, control logic 440 receives address ADDR and decodes address ADDR to detect a group in which selected memory cells are located. Typically, the group is detected according to row address Xj. Control logic 440 then controls reference voltage generator 450 to generate a reference voltage Vref corresponding to the detected group.

Then, under the control of control logic 440, reference voltage generator 450 generates a reference voltage Vref corresponding to the group to which selected memory cells belong. For example, where selected memory cells belong to first group 411, reference voltage generator 450 generates a first reference voltage Vref_1, and where selected memory cells belong to second group 412, reference voltage generator 450 generates a second reference voltage Vref_2.

The level of reference voltage Vref can be varied for different groups according to corresponding bitline delays. For example, second reference voltage Vref_2 can be relatively lower than first reference voltage Vref_1 because memory cells in second group 412 are connected to trigger circuit 435 through a longer path having greater bitline delays.

Figure 11:
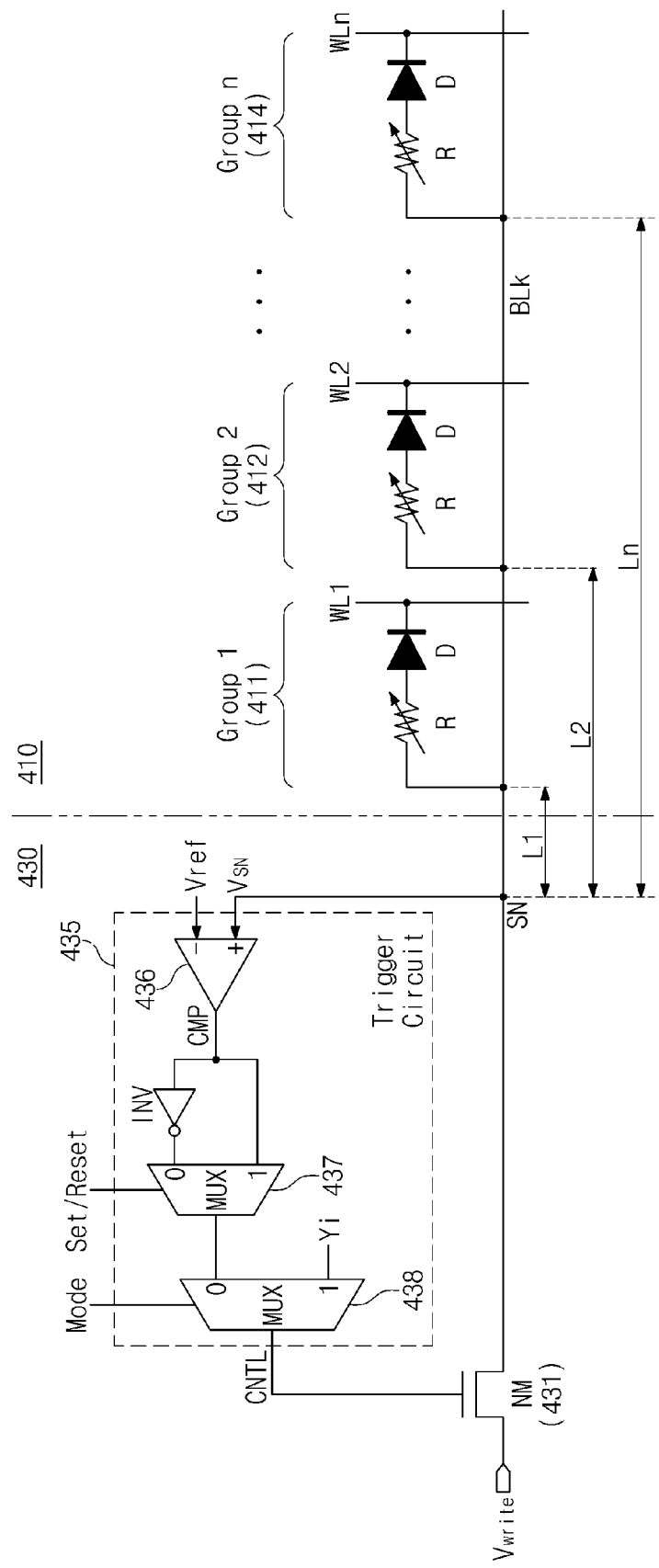
FIG. 11 is a circuit diagram illustrating a structure of FIG. 10.

FIG. 11 is a circuit diagram illustrating an example structure of read/write circuit 430 and cell array 410. For simplicity of illustration, FIG. 11 shows a single column of cell array 410.

Trigger circuit 435 and a transistor 431 are substantially the same as trigger circuit 120 and transistor 130a illustrated in FIG. 5. However, in trigger circuit 435, a reference voltage Vref for determining a turn-off time of transistor 431 varies according to cell groups 411 through 414.

Where a memory cell in first group 411 is selected by row address Xj, reference voltage generator 450 generates first reference voltage Vref_1. Where a memory cell in second group 412 is selected by row address Xj, reference voltage generator 450 generates second reference voltage Vref_2. Where a memory cell in an n-th group 414 is selected by a row address Xj, reference voltage generator 450 generates an n-th reference voltage Vref_n.

A distance L2 between the memory cell in second group 412 and a sensing node SN is greater than a distance L1 between the memory cell in first group 411 and sensing node SN, and a distance Ln between the memory cell in the n-th group 414 and sensing node SN is greater than distance L2. A bitline delay of the memory cell in second group 412 is longer than a bitline delay of the memory cell in first group 411, and a bitline delay of the memory cell in n-th group 414 is longer than a bitline delay of the memory cell in second group 412. Due to the above factors, the timing differs for supplying write voltage $V_{write}$ to different cell groups.

Different bitline delays between cell groups can be compensated by controlling reference voltage Vref. For example, different bitline delays can be compensated for by providing a lower reference voltage to cell groups having a greater bitline delay.

Figure 12:
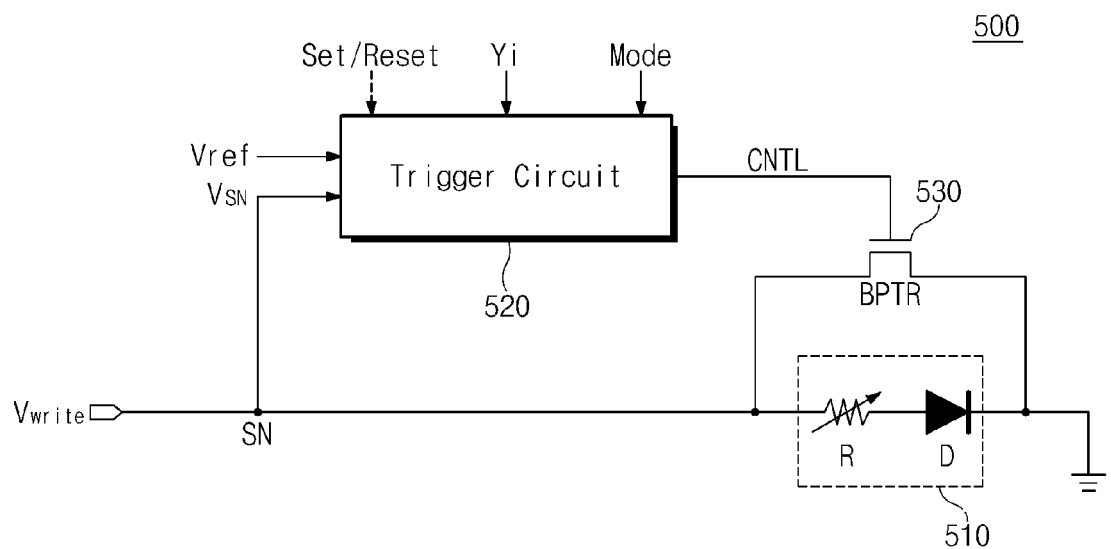
FIG. 12 is a block diagram illustrating a variable resistance memory device in accordance with an embodiment of the inventive concept.

FIG. 12 is a block diagram illustrating a variable resistance memory device 500 according to an embodiment of the inventive concept.

Referring to FIG. 12, variable resistance memory device 500 comprises a memory cell 510, a trigger circuit 520, and a bypass transistor 530. Trigger circuit 520 controls write voltage $V_{write}$ using a feed-forward method rather than a feedback method as used in embodiments described above.

Memory cell 510 is substantially the same as the memory cells illustrated in FIGS. 4, 5, 7, 9, and 10. Trigger circuit 520 is similar to one of the trigger circuits illustrated in FIGS. 5, 7, 9, and 11. However, a switch control signal CNTL generated by trigger circuit 520 is provided to bypass transistor 530 disposed at both sides of memory cell 510. Bypass transistor 530 shunts write voltage $V_{write}$ to ground in response to switch control signal CNTL. In particular, where trigger circuit 520 detects that memory cell 510 is programmed to a target state, trigger circuit 520 generates switch control signal CNTL with logic '1' to turn on bypass transistor 530. Then, both sides of memory cell 510 are connected to ground. A difference of electric potential between both sides of memory cell 510 is almost 0V, so memory cell 510 maintains a stable state.

Variable resistance memory device 500 can be modified in a variety of ways, such as adding an additional switch, such as switch 130 of FIG. 4, to further control node voltage $V_{SN}$.

Figure 13:
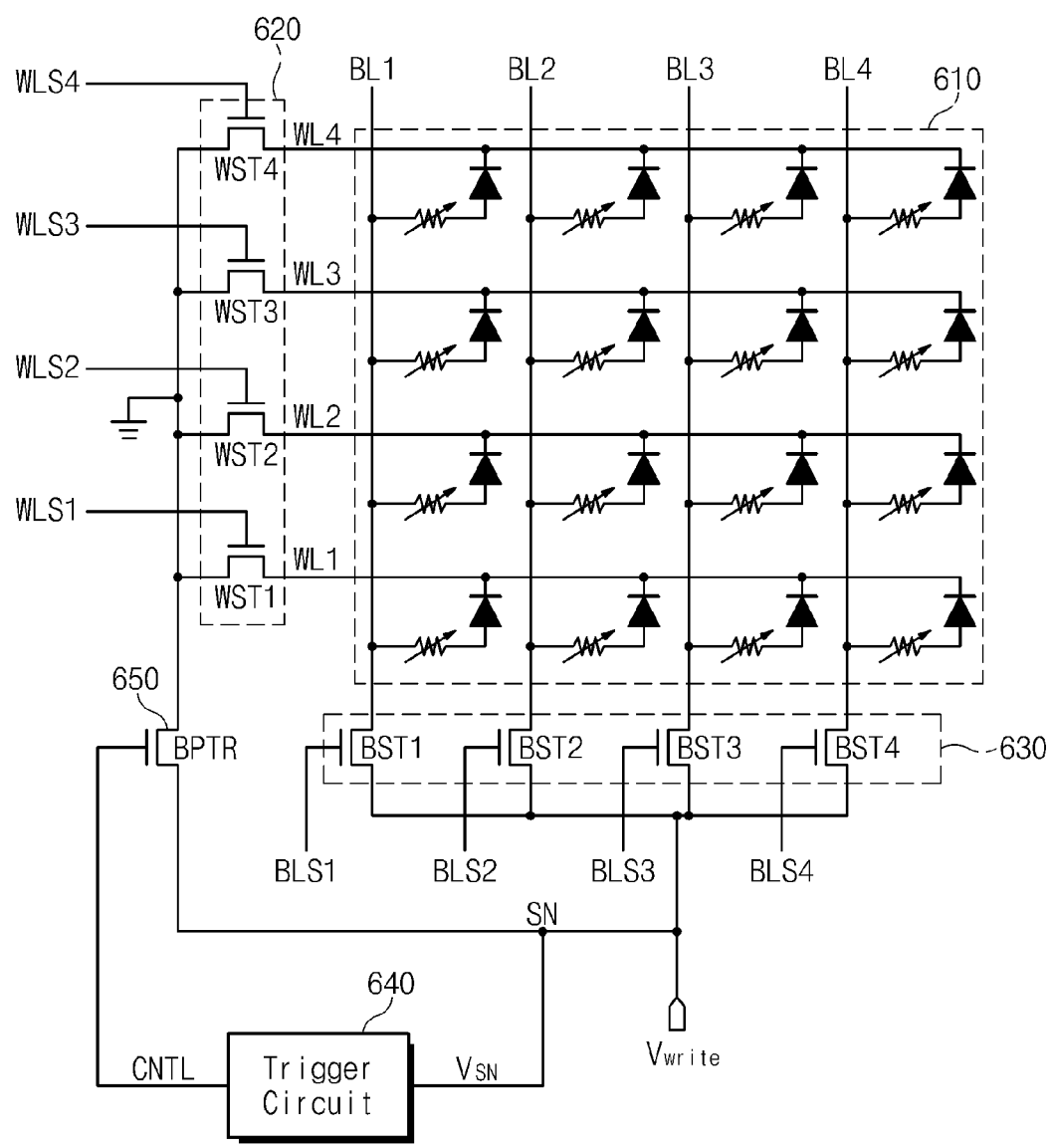
FIG. 13 is a circuit diagram illustrating a variable resistance memory device in accordance with an embodiment of the inventive concept.

FIG. 13 is a circuit diagram illustrating a variable resistance memory device 600 according to an embodiment of the inventive concept.

Referring to FIG. 13, variable resistance memory device 600 comprises a cell array 610, a row select circuit 620, a column select circuit 630, a trigger circuit 640, and a bypass transistor 650.

Cell array 610 comprises memory cells arranged in an array of four rows and four columns. The memory cells are connected to a plurality of wordlines WL1-WL4 and a plurality of bitlines BL1-BL4. Each memory cell comprises a variable resistance device as a memory element.

Row select circuit 620 selects any of wordlines WL1-WL4 in response to wordline select signals WLS1-WLS4. For instance, to select a wordline WL2, a wordline select signal WLS2 is activated, and wordline WL2 is connected to ground through a transistor WST2.

Column select circuit 630 selects any one bitline in response to bitline select signals BLS1-BLS4. Column select circuit 630 provides a write voltage $V_{write}$ to a selected bitline in response to the bitline select signals BLS1-BLS4.

Trigger circuit 640 detects a moment where a selected memory cell is programmed and controls bypass transistor 650 to connect the selected memory cell to ground after the selected memory cell is programmed. Trigger circuit 640 can be implemented similar to any one of the trigger circuits illustrated in FIGS. 5, 7, 9, and 11.

The embodiment of FIG. 13 can be modified in a variety of ways, including applying different reference voltages to trigger circuit 640 according to different row addresses as described with reference to FIGS. 10 and 11.

Figure 14:
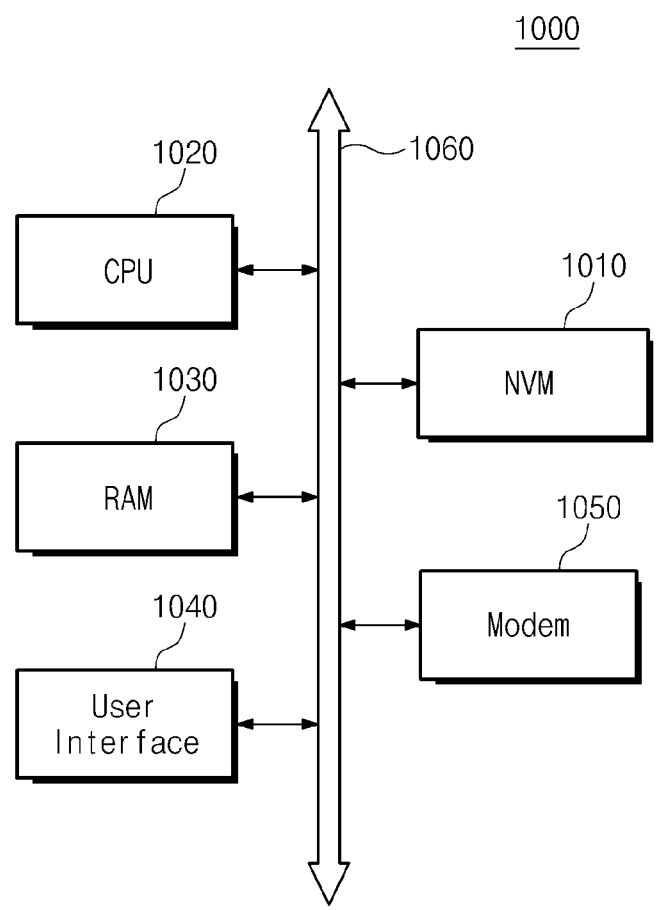
FIG. 14 is a block diagram illustrating a computer system comprising a variable resistance memory device according to an embodiment of the inventive concept.

FIG. 14 is a block diagram illustrating a computer system 1000 comprising a variable resistance memory device according to an embodiment of the inventive concept.

Referring to FIG. 14, computer system 1000 comprises a nonvolatile memory device 1010, a microprocessor 1020, a RAM 1030, a user interface 1040 and a modem 1050, such as a baseband chipset, that are electrically connected to a system bus 1060. Nonvolatile memory device 1010 comprises rewritable variable resistance memory cells.

Where computer system 1000 is a mobile device, a battery can be provided to supply an operating voltage. Computer system 1000 can further comprise various additional features, such as an application chipset, a camera image processor CIS, or a mobile DRAM.

Figure 15:
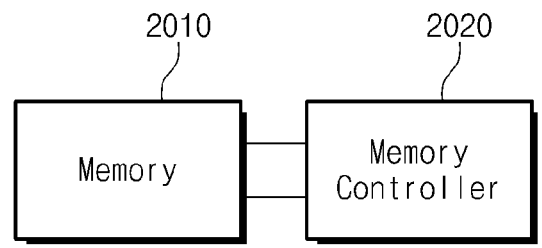
FIG. 15 is a block diagram illustrating a memory system comprising a variable resistance memory device according to an embodiment of the inventive concept.

FIG. 15 is a block diagram illustrating a memory system comprising a variable resistance memory device according to an embodiment of the inventive concept.

Referring to FIG. 15, the memory system comprises a memory 2010 and a memory controller 2020 electrically connected to memory 2010. Memory 2010 can take the form of one of the variable resistance memory devices described with reference to FIGS. 4-13. Memory controller 2020 generates signals for controlling memory 2010. For example, memory controller 2020 can generate command and address signals for accessing memory 2010.

Memory controller 2020 typically comprises a memory interface, a host interface, an error correction code (ECC) circuit, a central processing unit (CPU), and a buffer memory. The memory interface provides data received from the buffer memory to memory 2010 or provides data read from memory 2010 to the buffer memory. Also, the memory interface can provide commands and addresses from an external source to memory 2010.

The host interface can communicate with the external host using one of several protocols, such as universal serial bus (USB), small computer system interface (SCSI), peripheral component interconnect (PCI) express, advanced technology attachment (ATA), parallel ATA (PATA), serial ATA (SATA), or serial attached SCSI (SAS).

The ECC circuit generates error correction codes for data transmitted to memory 2010 and stores the generated ECC in a specific region of memory 2010 together with the data. The ECC circuit detects errors in data read from memory 2010. Where the detected errors are in a correctable range, the ECC circuit corrects the detected error.

The CPU analyzes and processes signals received from an external host. The CPU communicates with the external host and memory 2010 through the host interface or the memory interface. The CPU controls write, read, and erase operations of memory 2010 according to firmware associated with memory 2010. The buffer memory temporarily stores write data provided from the external host or data read from memory 2010.

Figure 16:
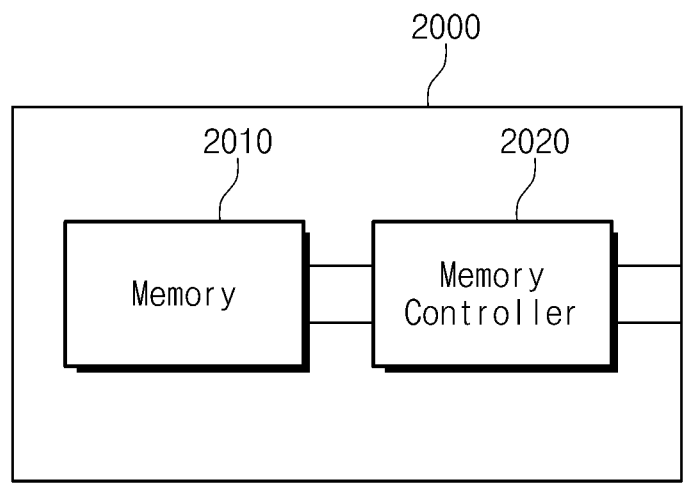
FIG. 16 is a block diagram illustrating a memory card comprising a variable resistance memory device according to an embodiment of the inventive concept.

FIG. 16 is a block diagram illustrating a memory card 2000 comprising a variable resistance memory device according to an embodiment of the inventive concept.

The memory card of FIG. 16 is the substantially same as the memory system of FIG. 15 except that memory 2010 and memory controller 2020 are mounted on memory card 2000. Memory card 2000 can be installed in an electronic device such as a digital camera, personal media player (PMP), a mobile phone, or a notebook computer. Memory card 2000 can take a variety of forms, such as a multimedia card (MMC), a secure digital (SD) card, a micro SD card, a memory stick, an ID card, a PCMCIA card, a chip card, a USB card, a smart card, or a compact flash card.

Figure 17:
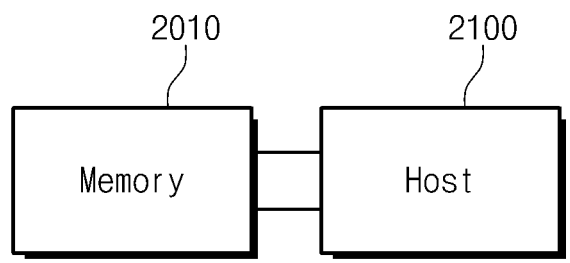
FIG. 17 is a block diagram illustrating an electronic system comprising a variable resistance memory device connected to a host according to an embodiment of the inventive concept.

FIG. 17 is a block diagram illustrating an electronic system comprising a variable resistance memory device connected to a host according to an embodiment of the inventive concept.

Referring to FIG. 17, memory 2010 is connected to a host 2100. Host 2100 can take various forms, such as a digital camera, a PMP, a mobile phone, or a notebook computer. Host 2100 provides control signals for controlling memory 2010. For example, host 2100 can provide command and address signals for accessing memory 2010. Memory 2010 can take the form of one of the variable resistance memory devices illustrated in FIGS. 4, 5, 7, 9, 10, and 13.

Figure 18:
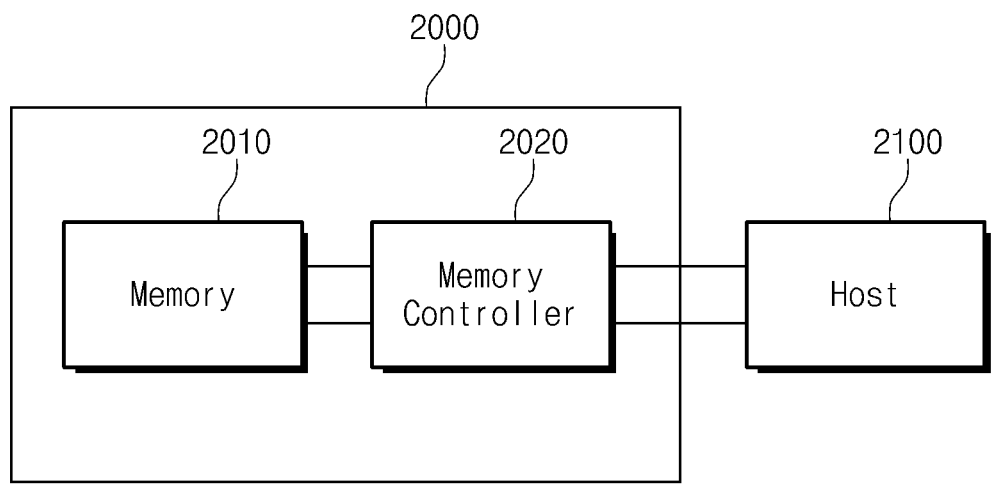
FIG. 18 is a block diagram illustrating a computer system comprising a memory card connected to a host according to an embodiment of the inventive concept.

FIG. 18 is a block diagram illustrating a computer system comprising a memory card connected to a host according to an embodiment of the inventive concept. In this embodiment, host 2100 provides commands, addresses, and data to memory controller 2020. In response to the signals from host 2100, memory controller 2020 generates control signals to access memory 2010.

Figure 19:
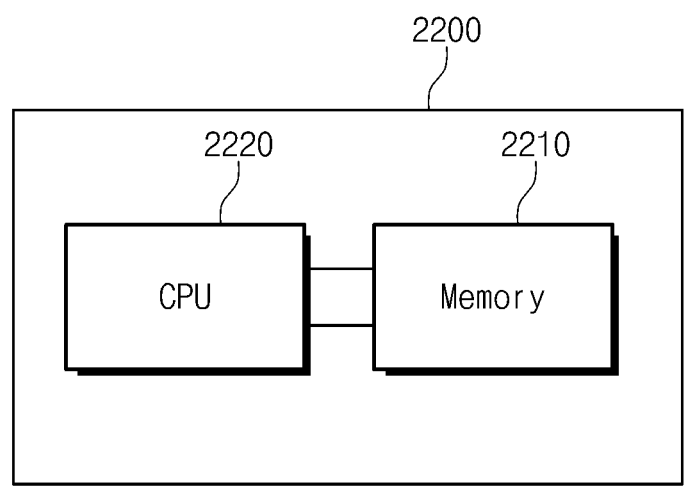
FIG. 19 is a block diagram illustrating a computer system comprising a variable resistance memory device connected to a central processing unit according to an embodiment of the inventive concept.

FIG. 19 is a block diagram illustrating a computer system 2200 comprising a variable resistance memory device connected to a CPU according to an embodiment of the inventive concept.

Referring to FIG. 19, computer system 2200 comprises a memory 2210 electrically connected to a CPU 2220 by a data bus. Computer system 2200 can take a variety of forms, such as a digital camera, a PMP, a mobile phone, a desk top computer, or a notebook computer.

Figure 20:
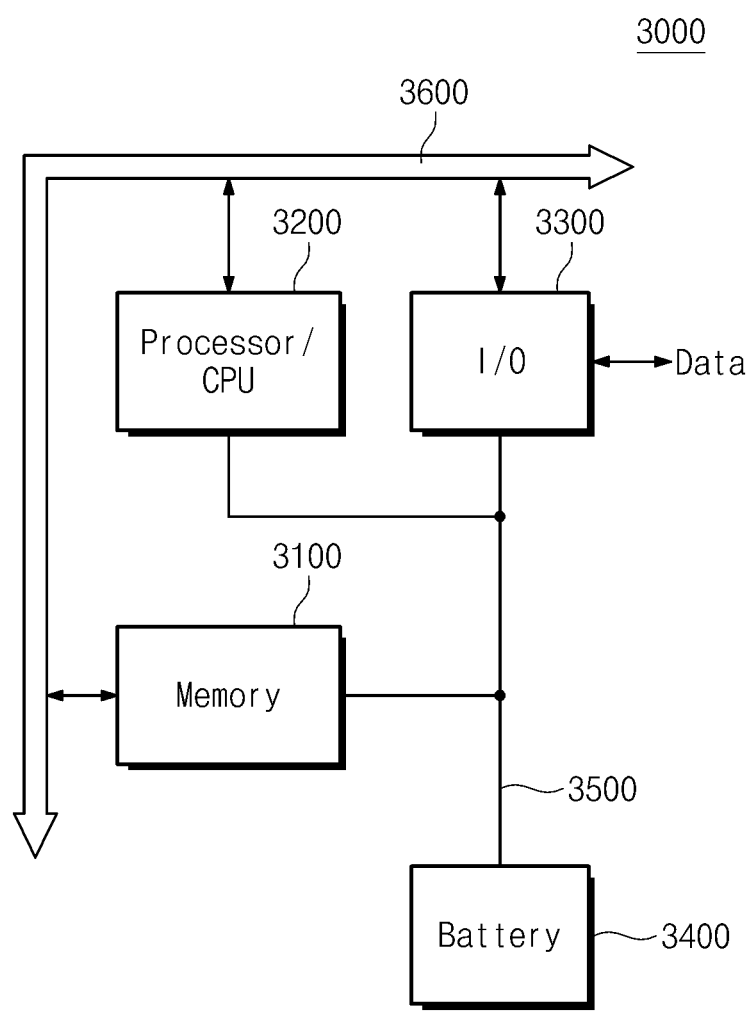
FIG. 20 is a block diagram of a portable system comprising a variable resistance memory device according to an embodiment of the inventive concept.

FIG. 20 is a block diagram of a portable system 3000 comprising a variable resistance memory device according to an embodiment of the inventive concept.

Referring to FIG. 20, portable system 3000 comprises a memory 3100 connected to a microprocessor 3200 through a bus line 3600. Memory 3100 can be driven as a main memory of portable system 3000. A battery 3400 provides a power supply to microprocessor 3200, an input/output device 3300, and memory 3100 through a power supply line 3500

Input/output device 3300 receives data from an external source and provides the received data to microprocessor 3200 through bus line 3600. Microprocessor 3200 processes the received data and provides the processed data to memory 3100 through bus line 3600. Memory 3100 stores the data in selected memory cells. Data stored in memory 3100 is read by microprocessor 3200 and output to an external destination through input/output device 3300. Because memory 3100 is a nonvolatile memory, it retains stored data even where battery 3400 is not provided to power supply line 3500. In addition, memory 3100 can provide other advantages such as relatively high operating speed and low power consumption compared with other types of memory.

Figure 21:
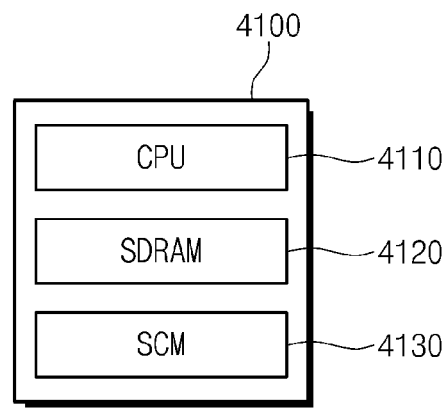
FIG. 21 is a block diagram illustrating an example of a memory system comprising a variable resistance memory device according to an embodiment of the inventive concept.

FIG. 21 is a block diagram illustrating an example of a memory system comprising a variable resistance memory device according to an embodiment of the inventive concept.

Referring to FIG. 21, a memory system 4100 comprises a CPU 4110, a synchronous DRAM (SDRAM) 4120, and a SCM 4130. SCM 4130 can be used as a data storage memory in place of a flash memory.

SCM 4130 has fast data access speed compared with a flash memory. For example, in a PC environment where CPU 4110 operates at 4 GHz, a phase change memory device, which is one type of SCM 4130, can have an access speed 32 times as fast as a flash memory. Thus, memory system 4100 comprising SCM 4130 has a performance advantage compared with a memory system comprising a flash memory.

Figure 22:
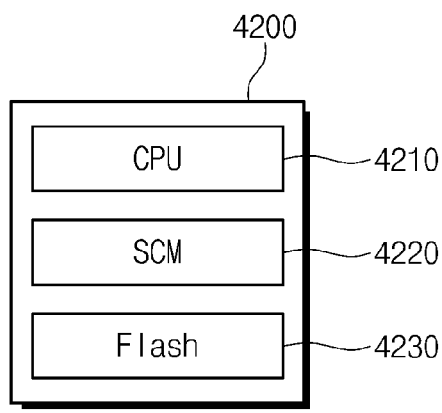
FIG. 22 is a block diagram illustrating a memory system comprising a variable resistance memory device according to an embodiment of the inventive concept.

FIG. 22 is a block diagram illustrating a memory system comprising a variable resistance memory device according to an embodiment of the inventive concept.

Referring to FIG. 22, a memory system 4200 comprises a CPU 4210, an SCM 4220, and a flash memory 4230. In this example, SCM 4220 is used as a main memory in place of an SDRAM.

SCM 4220 has low power consumption compared with a SDRAM. Because main memory consumes a significant amount of the total power in many electronic systems, a significant amount of research is being conducted to reduce power consumption in main memories. Compared with certain DRAMs, SCM 4220 can reduce dynamic energy consumption by an average of 53% and energy consumption due to power loss by an average of 73%. Consequently, a memory system comprising SCM 4220 can reduce power consumption compared with a memory system loaded with an SDRAM.

Figure 23:
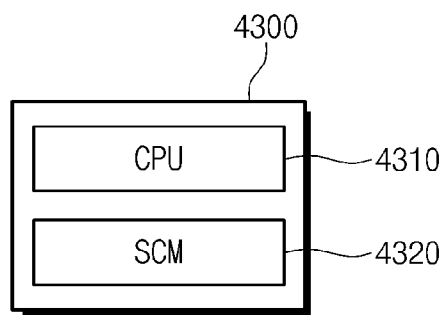
FIG. 23 is a block diagram illustrating a memory system comprising a variable resistance memory device according to an embodiment of the inventive concept.

FIG. 23 is a block diagram illustrating a memory system comprising a variable resistance memory device according to an embodiment of the inventive concept.

Referring to FIG. 23, a memory system 4300 comprises a CPU 4310 and an SCM 4320. SCM 4320 can be used as a main memory in place of an SDRAM and can be used for mass data storage memory in place of a flash memory. Memory system 4300 can provide various benefits, such as relatively efficient data access, power consumption, and space utilization, and reduced cost.

The above described devices and systems can be mounted by various types of packages, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

As indicated by the foregoing, various embodiments of the inventive concept can improve the reliability of data stored in a variable resistance memory device by preventing variable resistance memory cells from assuming unstable states. Certain embodiments can also reduce power consumption and improve the lifespan of variable resistance memory devices by reducing the amount of current that flows through the devices.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a variable resistance memory device including a cell array having a plurality of variable resistance memory cells, comprising:
    applying a write voltage to an input terminal of a variable resistance memory cell of the cell array;
    generating a reference voltage based on a delay required for the write voltage to reach the variable resistance memory cell;
    comparing a voltage level of the input terminal with the reference voltage; and
    cutting off the write voltage from the input terminal responsive to said comparing.

2. The method of claim 1, wherein the variable resistance memory cell is programmed to a set state responsive to the write voltage.

3. The method of claim 1, wherein the variable resistance memory cell is programmed to a reset state responsive to the write voltage.

4. The method of claim 1, wherein the reference voltage is generated responsive to an address of the variable resistance memory cell within the cell array.

5. The method of claim 1, wherein said generating comprises decreasing the reference voltage as the delay increases.

6. The method of claim 1, wherein said cutting off the write voltage occurs upon determination that the voltage level of the input terminal is higher than the reference voltage.

7. The method of claim 1, wherein said cutting off the write voltage occurs upon determination that the voltage level of the input terminal is lower than the reference voltage.

8. The method of claim 1, wherein said cutting off the write voltage comprises shunting the write voltage at the input terminal to ground via a bypass transistor.

9. The method of claim 1, wherein the variable resistance memory cell comprises a unipolar variable resistance device.

10. A method of programming a variable resistance memory device, comprising:

applying a write voltage to an input terminal of a variable resistance memory cell;

determining whether the variable resistance memory cell is programmed to a target state by detecting a voltage fluctuation at the input terminal; and cutting off the write voltage from the input terminal upon determining that the variable resistance memory cell is programmed to a target state, wherein said determining whether the variable resistance memory cell is programmed to the target state comprises comparing a voltage level of the input terminal with a reference voltage, and wherein the reference voltage is adjusted according to a delay required for the write voltage to reach the variable resistance memory cell.

11. The method of claim 10, wherein the variable resistance memory cell variable resistance device.

12. The method of claim 10, wherein the reference voltage is adjusted to decrease as the delay increases.

13. The method of claim 10, wherein the variable resistance memory cell is determined as programmed to the target state upon determination that the voltage level of the input terminal is higher than the reference voltage.

14. The method of claim 10, wherein the variable resistance memory cell is determind as programmed to the target state upon determination that the voltage level of the input terminal is lower than the reference voltage.

* * * * *